(12) United States Patent
Kinzer

(10) Patent No.: US 7,498,617 B2
(45) Date of Patent: Mar. 3, 2009

(54) III-NITRIDE INTEGRATED SCHOTTKY AND POWER DEVICE

(75) Inventor: Daniel M. Kinzer, El Segundo, CA (US)

(73) Assignee: International Rectifier Corporation, El Segundo, CA (US)

(*) Notice: Subject to any disclaimer, the term of this patent is extended or adjusted under 35 U.S.C. 154(b) by 371 days.

(21) Appl. No.: 11/345,753

(22) Filed: Feb. 2, 2006

(65) Prior Publication Data

US 2006/0175633 A1 Aug. 10, 2006

Related U.S. Application Data

(60) Provisional application No. 60/649,393, filed on Feb. 2, 2005.

(51) Int. Cl.
*H01L 29/872* (2006.01)

(52) U.S. Cl. .......... 257/192; 257/109; 257/155; 257/194; 257/195; 257/282; 257/287

(58) Field of Classification Search ............ 257/109, 257/155, 192, 194, 195, 282, 287, E29.12, 257/E29.122, E29.14, E29.144, E29.149, 257/E29.219, E29.246, E29.249
See application file for complete search history.

(56) References Cited

U.S. PATENT DOCUMENTS 6,320,205 B1 * 11/2001 Pfirsch et al. .............. 257/77
7,256,432 B2   8/2007 Okamoto et al.
2006/0043415 A1 * 3/2006 Okamoto et al. .......... 257/192

FOREIGN PATENT DOCUMENTS

JP       20044214471    7/2004

OTHER PUBLICATIONS

Japanese Office Action that issued in corresponding Japanese Application Serial No. 2006-25639 on Jan. 22, 2008 along with an English translation.

* cited by examiner

*Primary Examiner*—Ngan Ngo
*Assistant Examiner*—Benjamin Tzu-Hung Liu
(74) *Attorney, Agent, or Firm*—Ostrolenk, Faber, Gerb & Soffen, LLP

(57) ABSTRACT

A III-nitride power device that includes a Schottky electrode integrated with a power switch. The combination is used in power supply circuits such as a boost converter circuit.

18 Claims, 4 Drawing Sheets

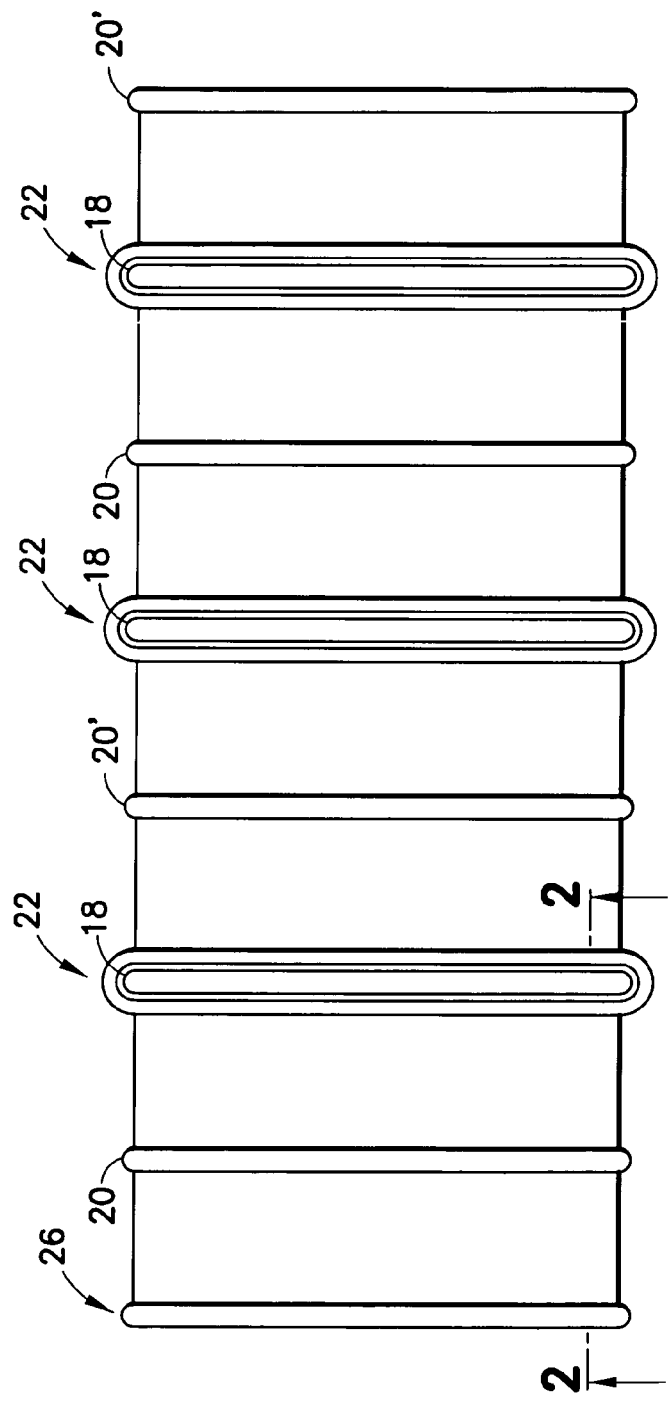
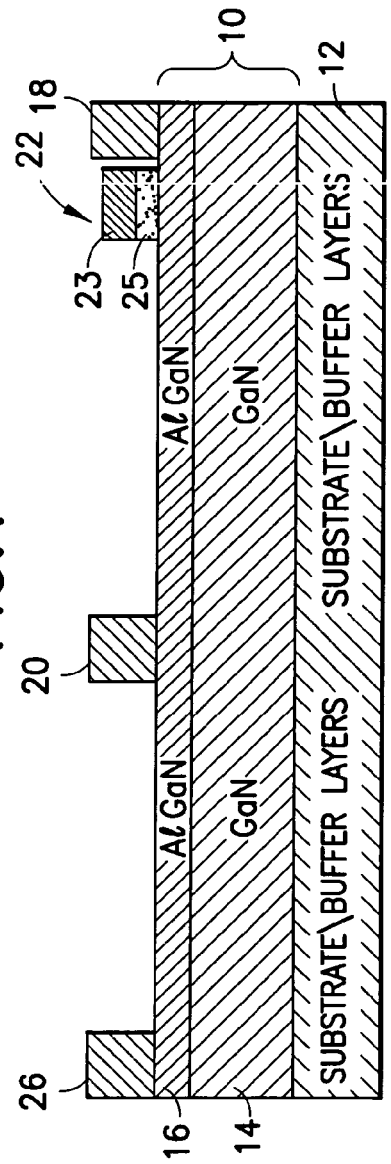
FIG.1
FIG.2

III-NITRIDE INTEGRATED SCHOTTKY AND POWER DEVICE

RELATED APPLICATION

This application is based on and claims benefit of U.S. Provisional Application Ser. No. 60/649,393, filed on Feb. 2, 2005, entitled GaN MONOLITHIC FETKY SYNCHRONOUS RECTIFIER FOR BOOST DIODE, to which a claim of priority is hereby made and the disclosure of which is incorporated by reference.

BACKGROUND OF THE INVENTION

The present invention relates to a III-nitride heterojunction power semiconductor devices and power supply circuit including the same.

III-nitride heterojunction power devices are well known. A typical III-nitride power semiconductor device includes a drain electrode, a source electrode and a gate electrode disposed between the drain electrode and the source electrode. The gate electrode controls the current between the source electrode and the drain electrode.

III-nitride power semiconductor devices are desirable for power applications, for example, power supply applications due their low on resistance and high breakdown voltage. In such applications, it may be necessary to switch the current path between two power switches that are connected to a common energy storage device, such as an inductor. However, unless the switching is timed perfectly, the energy in the inductor may drive the voltage high enough that one or both devices breakdown. It is also often advantageous to have an antiparallel diode to conduct current in the reverse direction to prevent opposite polarity voltage spikes. It is, therefore, desirable to have a III-nitride power device suitable for use in a power supply that does not suffer from the drawbacks of the prior art.

It is also desirable to have a power supply circuit that includes a III-nitride power device that does not suffer from the drawbacks of the prior art.

SUMMARY OF THE INVENTION

A device according to the present invention is a monolithic integrated III-nitride power device that includes a heterojunction III-nitride body having a first III-nitride layer, and a second III-nitride layer having a band gap different from that of the first III-nitride layer disposed over the first III-nitride layer, a first power electrode electrically connected to the second III-nitride layer, a second power electrode electrically connected to the second III-nitride layer, a gate structure disposed over the second III-nitride layer between the first power electrode and the second power electrode, and a schottky electrode in schottky contact with the second III-nitride layer.

A power device according to the present invention can be used in a power supply circuit, such as boost circuit, which may include a control semiconductor switch, a device according to the present invention as a synchronous semiconductor rectifier, an output capacitor and an energy storage device such as an inductor.

Embodiments and advantages of the present invention will become apparent from the following description of the invention which refers to the accompanying drawings.

BRIEF DESCRIPTION OF THE DRAWINGS

FIG. 1 shows a top plan view of a portion of a device according to an embodiment of the present invention.

FIG. 2 shows a cross-sectional view of a device according to the embodiment shown in FIG. 1 along line 2-2 viewed in the direction of the arrows.

DETAILED DESCRIPTION OF THE EMBODIMENTS

Figure 3:
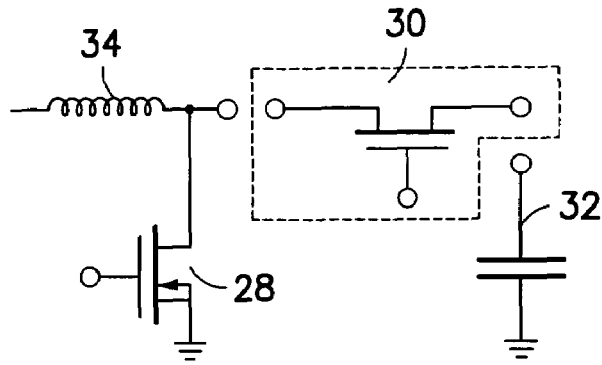
FIG. 3 illustrates a boost type power supply circuit.

Referring to FIGS. 1 and 2, a power semiconductor device according to the first embodiment of the present invention includes a III-nitride based heterojunction 10 disposed over a support body 12. Heterojunction 10 includes a first III-nitride semiconductor body 14, and a second III-nitride semiconductor body 16 over first III-nitride semiconductor body 14. A first power electrode 18 (i.e. source electrode) and a second power electrode 20 (i.e. drain electrode) are electrically connected to second III-nitride semiconductor body 16 through a direct ohmic connection or any other suitable means. A gate structure 22 is disposed between first power electrode 18 and second power electrode 20 over second III-nitride semiconductor body 14. In the preferred embodiment of the present invention, gate structure 22 includes gate electrode which is capacitively connected to second III-nitride semiconductor layer 16 through gate insulation body 25. Alternatively, gate structure 22 may include a schottky gate electrode connected to second III-nitride semiconductor body 16. It should also be noted that gate structure 22 is disposed around first power electrode 18, and, thus can be operated to simultaneously turn on and off the channel between second power electrodes 20, 20'.

According to one aspect of the present invention, a schottky electrode 26 is provided to make schottky contact with second III-nitride layer 16. A schottky electrode 26 is preferably provided for every nth active cell (each active cell as referred to herein includes at least a first power electrode 18, a second power electrode 20 and a gate structure 22 disposed in between) as shown in order to optimize the use of the active area and achieve the desired efficiency. It should be noted that although it is preferred to provide an integrated schottky electrode every nth cell, a schottky electrode 26 can be provided in every cell without deviating from the scope and the spirit of the present invention. Preferred range for n is 5-20.

Referring to FIG. 3, a conventional boost-type power supply includes a control power device 28, a synchronous power device 30, an output capacitor 32, and an inductor 34. According to one aspect of the present invention, a device according to the present invention can be arranged in a boost configuration in the place of synchronous power device 30. For example, it may be used instead of a boost diode in a power factor correction (PFC) circuit for AC/DC converters.

Figure 4A:
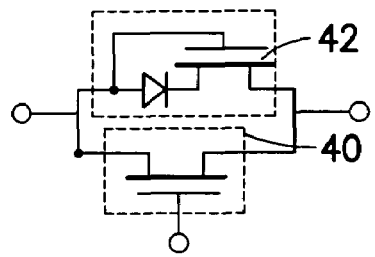
FIGS. 4A and 4B illustrate an operative configuration for a device according to the present invention.
Figure 4B:
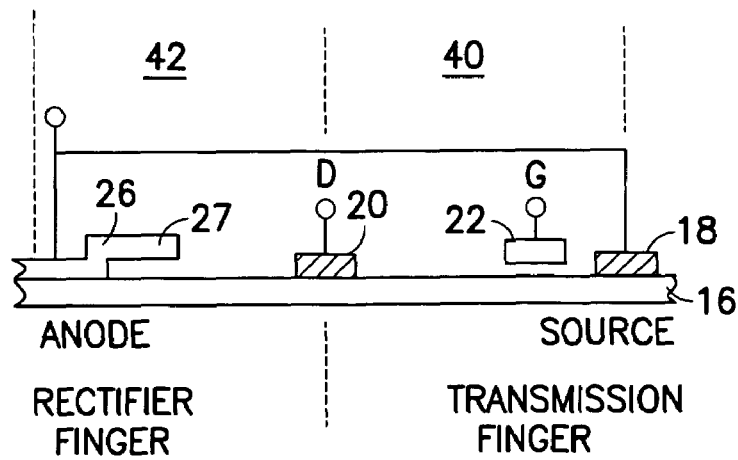

A device according to the present invention can be configured in a number of different ways. Referring, for example, to FIGS. 4A and 4B, schottky electrode 26 and first power electrode 18 can be shorted to one another. It should be noted that although the gate of a device according to the present invention still needs to be driven synchronously, some dead band would now be allowed because the rectifier fingers would conduct the inductor current during the deadband and prevent the voltage from overshooting. Note that schottky electrode 26 preferably includes a field plate portion 27 which is spaced from the top of the semiconductor body and may be disposed over a field insulation. The characteristics of a field plate are well known and thus will not be repeated here for the sake of brevity. As illustrated in FIGS. 4A and 4B, a device according to the present invention includes a rectifier current path 42, and a transistor current path 40.

Figure 5A:
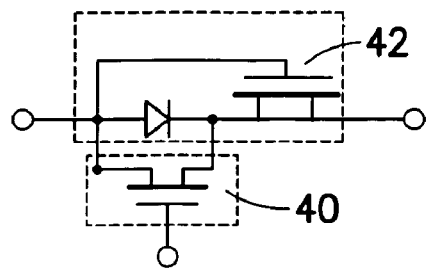
FIGS. 5A and 5B illustrate another operative configuration for a device according to the present invention.
Figure 5B:
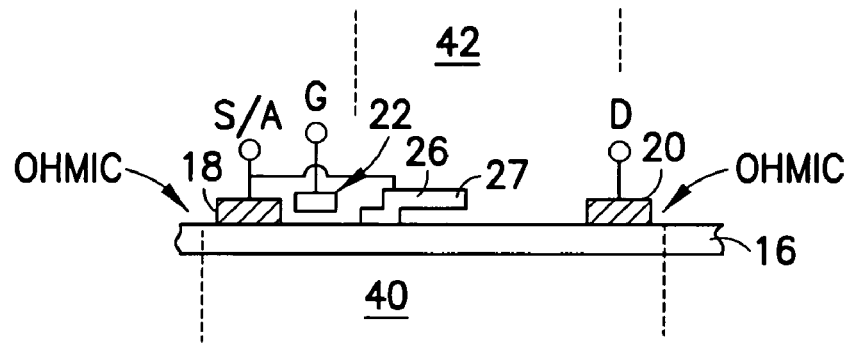
Figure 6:
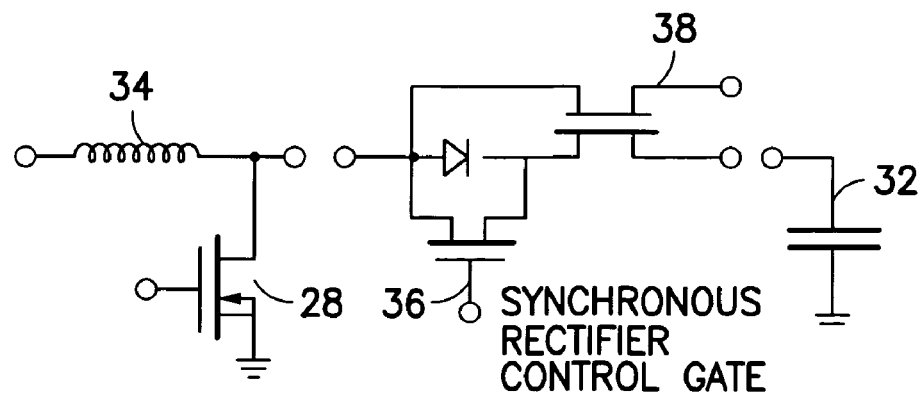
FIG. 6 illustrates a boot type power supply that includes a device according to the present invention as a synchronous power device serving as a rectifier.

Alternatively, schottky electrode 26 could be shorted out during the on pulse by a monolithic low voltage HEMT, or an external transistor as illustrated by FIGS. 5A and 5B. In such a configuration, some dead band would be allowed because every cell could include a rectifier current path. Every cell also has a direct ohmic contact 18 to the two dimensional electron gas (2DEG) and a gate to turn on and off the 2DEG channel between the ohmic contact 18 and schottky anode 26. During conduction periods, this gate can allow HEMT current to bypass the schottky anode, thus lowering the forward drop. A low voltage HEMT can be applied so very little area is added for the gate. In addition, the presence of the anode protects the gate from high fields. FIG. 6 schematically illustrates the configuration shown by FIGS. 5A and 5B as incorporated within a boost circuit. Note that the circuit illustrated by FIG. 6 can receive a signal for the control of gate 36 of the synchronous rectifier, and can receive a signal for at another gate 38 for the control of a surge current. A suitable HEMT to realize a synchronous power device according to the present invention may be a bidirectional III-nitride based power device such as the one disclosed in U.S. application Ser. No. 11/056,062, assigned to the assignee of the present invention, which includes an integrated schottky electrode according to the principles and teachings disclosed herein.

Figure 7A:
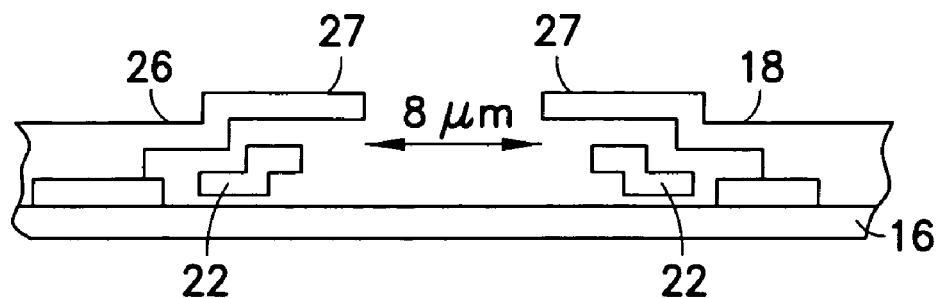
FIG. 7A illustrates a portion of a III-nitride bidirectional semiconductor device.
Figure 7B:
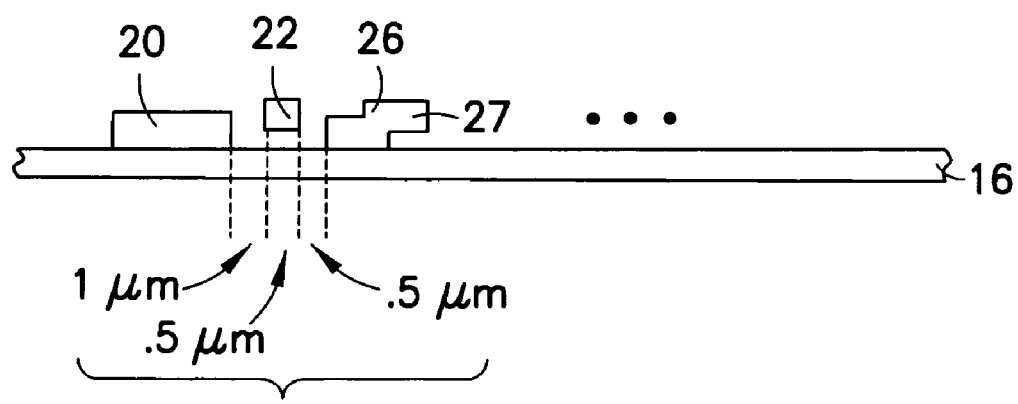
FIG. 7B illustrates a schottky electrode integrated with a bidirectional device.

Referring to FIG. 7A, a bidirectional III-nitride device includes two gates 22, a first power electrode 18, and a second power electrode 20. Note that according to the preferred design each power electrode includes a field plate portion 27 that extends over a respective gate 22. Referring to FIG. 7B, a schottky diode can be integrated with a bidirectional device as shown in FIG. 7A by adding schottky electrode 26 without consuming too much of the semiconductor area.

Figure 8:
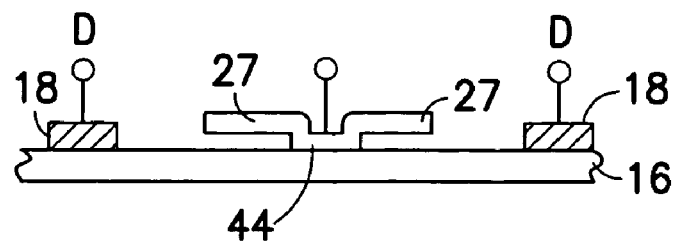
FIG. 8 illustrates a III-nitride device according to another embodiment of the present invention.

Referring to FIG. 8, in another embodiment schottky electrode 26 and gate electrode (which make schottky contact with semiconductor body 16) can be combined to form a single schottky and gate electrode 44. Note that electrode 44 includes two opposing field plates 27 one on each side thereof.

In a device according to any one of the embodiments of the present invention, first III-nitride semiconductor body is an alloy from the InAlGaN system, such as GaN, and second III-nitride semiconductor body 16 is another alloy from the InAlGaN system having a band gap that is different from that of first III-nitride semiconductor 14, whereby a two-dimensional electron gas is formed due to the heterojunction of the first and the second III-nitride semiconductor bodies as is well known in the art. For example, second III-nitride semiconductor body may be formed with AlGaN.

In addition, support body 12 is a combination of a substrate material and if required a buffer layer on the substrate to compensate for the lattice and thermal mismatch between the substrate and first III-nitride semiconductor body 14. For economic reasons, the preferred material for the substrate is silicon. Other substrate materials such as sapphire, and SiC can also be used without deviating from the scope and the spirit of the present invention.

AlN is a preferred material for a buffer layer. However, a multi-layer or graded transitional III-nitride semiconductor body may also be used as a buffer layer without deviating from the scope and the spirit of the present invention.

It is also possible to have the substrate made from the same material as first III-nitride semiconductor body and thus avoid the need for a buffer layer. For example, a GaN substrate may be used when first III-nitride semiconductor body 14 is formed with GaN.

The gate electrode may be composed of n type or p type silicon, or polysilicon of any desired conductivity, or TiW, aluminum, Ti/Al, refractory silicides, or other metallic layer. Ohmic electrodes may be composed of Ti/Al and may further include other metallic bodies over the top surface thereof such as Ti/TiW, Ni/Au, Mo/Au, or the like. Any other metal system that makes low resistance contact to the 2DEG may be employed. Gate insulation body 28 may be composed of SiN, $Al_2O_3$, $SiO_2$, HfO, MgO, $Sc_2O_3$, or the like. Schottky metal for schottky electrode 26 may include nickel, platinum, palladium, silicides of those metals, or any other metal with sufficient barrier height to keep leakage low.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A monolithic integrated III-Nitride power device comprising:
   a heterojunction III-nitride body including a first III-nitride layer, and a second III-nitride layer having a band gap different from that of said first III-nitride layer disposed over said first III-nitride layer;
   a source electrode electrically connected to said second III-nitride layer;
   a drain electrode electrically connected to said second III-nitride layer;
   a gate structure disposed over said second III-nitride layer between said source electrode and said drain electrode; and
   a schottky electrode in schottky contact with said second III-nitride layer and serving as an anode contact of a diode integrated with a transistor that includes said source electrode, said drain electrode and said gate structure.

2. A power device according to claim 1, wherein said first III-nitride layer is comprised of GaN and said second III-nitride layer is comprised of AlGaN.

3. A power device according to claim 1, wherein said first III-nitride layer is comprised of one alloy from the InAlGaN system and said second III-nitride layer is comprised of another alloy from the InAlGaN system having a band gap that is different from that of said one alloy.

4. A power device according to claim 1, wherein said source electrode and said drain electrode make ohmic contact with said second III-nitride layer.

5. A power device according to claim 1, wherein said gate structure includes a gate electrode and a gate insulation interposed between said heterojunction and said gate electrode.

6. A power device according to claim 5, wherein said gate insulation is comprised of silicon dioxide.

7. A power device according to claim 5, wherein said gate insulation is comprised of silicon nitride.

8. A power device according to claim 1, wherein said schottky electrode is disposed either between said drain electrode and said gate structure, or adjacent said drain electrode which is disposed between said schottky electrode and said gate structure.

9. A power device according to claim 1, wherein said schottky electrode includes at least one field plate portion.

10. A power device according to claim 1, wherein said schottky electrode includes at least two opposing field plate portions.

11. A power supply comprising:
a control semiconductor switch;
a synchronous semiconductor switch, said synchronous semiconductor switch including a heterojunction III-nitride body including a first III-nitride layer, and a second III-nitride layer having a band gap different from that of said first III-nitride layer disposed over said first III-nitride layer;
a source electrode electrically connected to said second III-nitride layer;
a drain electrode electrically connected to said second III-nitride layer;
a gate structure disposed over said second III-nitride layer between said source electrode and said drain electrode; and
a schottky electrode in schottky contact with said second III-nitride layer and shorted to said source electrode.

12. A power supply according to claim 11, wherein said first III-nitride layer is comprised of GaN and said second III-nitride layer is comprised of AlGaN.

13. A power supply according to claim 11, wherein said source electrode and said drain electrode make ohmic contact with said second III-nitride layer.

14. A power supply according to claim 11, wherein said gate structure includes a gate electrode and a gate insulation interposed between said heterojunction and said gate electrode.

15. A power supply according to claim 14, wherein said gate insulation is comprised of silicon dioxide.

16. A power supply according to claim 14, wherein said gate insulation is comprised of silicon nitride.

17. A power supply according to claim 11, further comprising an inductive energy storage element and an output capacitor.

18. A power supply according to claim 11, wherein said inductive energy storage element, said output capacitor, said control semiconductor switch and said synchronous semiconductor switch are arranged in a boost configuration.

* * * * *